US012791626B2

(12) United States Patent
Onda

(10) Patent No.: US 12,791,626 B2
(45) Date of Patent: Nov. 10, 2026

(54) ELECTRIC POWER CONVERSION DEVICE

(71) Applicant: Mitsubishi Electric Corporation, Tokyo (JP)

(72) Inventor: Kohei Onda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 59 days.

(21) Appl. No.: 18/874,598

(22) PCT Filed: Jul. 1, 2022

(86) PCT No.: PCT/JP2022/026483
§ 371 (c)(1),
(2) Date: Dec. 13, 2024

(87) PCT Pub. No.: WO2024/004208
PCT Pub. Date: Jan. 4, 2024

(65) Prior Publication Data
US 2026/0243847 A1 Aug. 20, 2026

(51) Int. Cl.
*H02M 1/08* (2006.01)
*G01R 31/42* (2006.01)
(Continued)

(52) U.S. Cl.
CPC ............ *G01R 31/42* (2013.01); *H02M 1/088* (2013.01); *H02M 1/32* (2013.01); *H02M 3/158* (2013.01); *H02M 7/537* (2013.01)

(58) Field of Classification Search
CPC ........ H02M 3/073; H02M 3/10; H02M 3/135; H02M 3/137; H02M 3/28; H02M 3/315;
(Continued)

(56) References Cited

U.S. PATENT DOCUMENTS 5,933,341 A 8/1999 Kuriyama et al.
9,729,081 B1 * 8/2017 Zou .................... H02M 1/0085
(Continued)

FOREIGN PATENT DOCUMENTS

JP H04-198772 A 7/1992
JP H10-257779 A 9/1998
(Continued)

OTHER PUBLICATIONS

Office Action issued Nov. 18, 2025 in Japanese Patent Application No. 2024-530262, 13 pages.
(Continued)

*Primary Examiner* — Jeffrey A Gblende
(74) *Attorney, Agent, or Firm* — XSENSUS LLP

(57) ABSTRACT

A power conversion device includes an arm pair including a first semiconductor switching element and a second semiconductor switching element connected in series between plus and minus terminals for DC. In the power conversion device, there are: a third resistor group connected in parallel to the first semiconductor switching element; a second resistor group connected in parallel to the second semiconductor switching element; a reference voltage generation circuit which generates first and second reference voltages obtained by dividing a voltage between the plus and minus terminals; and an abnormality determination circuitry which, after operations of both semiconductor switching elements are stopped, compares a detection voltage obtained through voltage division by the second resistor group and each of the first and second reference voltages, and determines whether or not either of the semiconductor switching elements has sustained main-withstand-voltage deterioration.

20 Claims, 12 Drawing Sheets

(51) Int. Cl.

| | |
|---|---|
| ***H02M 1/088*** | (2006.01) |
| ***H02M 1/32*** | (2007.01) |
| *H02M 3/158* | (2006.01) |
| *H02M 7/537* | (2006.01) |

(58) Field of Classification Search

CPC .... H02M 3/3155; H02M 3/325; H02M 3/335; H02M 7/10; H02M 7/515; H02M 7/521; H02M 7/53; H02M 7/537; H02M 7/5383; H02M 7/538466; H02M 7/53862; H02M 7/5387; H02M 7/53871; H02M 7/53873; H02M 7/53875; H02M 7/757; H02M 7/79; H02M 3/337; H02M 3/338; H02M 3/3382; H02M 3/3384; H02M 7/538; H02M 7/53806; H02M 7/53832; H02M 7/53835; H02M 7/487; H02M 7/539; H02M 7/23; H02M 7/217; H02M 7/21; H02M 7/12; H02M 7/04; H02M 7/00; H02M 7/5395; H02M 7/483; H02M 1/0009

See application file for complete search history.

(56) References Cited

U.S. PATENT DOCUMENTS

| | | | | |
|---|---|---|---|---|
| 10,014,776 | B2 * | 7/2018 | Kobayashi | H02P 29/0241 |
| 2013/0016542 | A1 | 1/2013 | Nakamura et al. | |
| 2016/0011266 | A1 * | 1/2016 | Osanai | G01R 31/42<br>324/762.01 |
| 2022/0059419 | A1 * | 2/2022 | Kurosawa | G01R 31/2853 |
| 2025/0293628 | A1 * | 9/2025 | Nishinouchi | H02P 29/024 |

FOREIGN PATENT DOCUMENTS

| | | | |
|---|---|---|---|
| JP | H10-341578 | A | 12/1998 |
| JP | 2004-317277 | A | 11/2004 |
| JP | 2013-243871 | A | 12/2013 |
| JP | 2019-110720 | A | 7/2019 |
| WO | 2011/121765 | A1 | 10/2011 |

OTHER PUBLICATIONS

International Search Report and Written Opinion mailed on Aug. 30, 2022, received for PCT Application No. PCT/JP2022/026483, filed on Jul. 1, 2022, 9 pages including English Translation.

* cited by examiner

ELECTRIC POWER CONVERSION DEVICE

CROSS-REFERENCE TO RELATED APPLICATION

This application is a national stage application, pursuant to 35 U.S.C. § 371, of International Patent Application No. PCT/JP2022/026483, filed Jul. 1, 2022, the entire contents of which is incorporated herein by reference.

TECHNICAL FIELD

The present disclosure relates to a power conversion device.

BACKGROUND ART

In a power conversion device, a power conversion function is realized by an operation of turning on/off a plurality of semiconductor switching elements composing a power converter. As examples of the semiconductor switching elements, there are voltage-driven semiconductor switching elements represented by metal-oxide-semiconductor field-effect transistors (MOSFETs) and insulated-gate bipolar transistors (IGBTs).

Each of the semiconductor switching elements is required to maintain, as a basic characteristic, a high insulation characteristic in a state where a gate thereof is OFF. However, the insulation characteristic might be gradually lost owing to, for example, moisture absorption by an insulation material for sealing, a latent imperfection in a semiconductor manufacturing process, and furthermore, undesigned overvoltage surge during operation. Considering this, the state of main-withstand-voltage deterioration of the semiconductor switching element is ascertained, and this ascertaining is expected to lead to realization of elimination of a downtime in the power conversion device through pre-break replacement of the semiconductor switching element. In particular, since a semiconductor switching element with a larger leakage current is considered to take a shorter time to be broken, technologies for highly accurately detecting a leakage current while the leakage current is still minute have been required.

As technologies for detecting an abnormality of the main withstand voltage of a semiconductor switching element in a power conversion device, there are methods disclosed in Patent Document 1 and Patent Document 2, for example. An abnormality detection device described in Patent Document 1 includes one or more parallel power conversion units. Each one of the parallel power conversion units is provided with one abnormality detection section and one high-selection terminal voltage detection section with a detection resistor, which correspond to the parallel power conversion unit. In the abnormality detection section of each of the parallel power conversion units, an abnormality in a corresponding power converter included in the parallel power conversion unit is detected on the basis of a voltage at a point of combining.

A power supply device described in Patent Document 2 has a configuration provided with an inverter circuit composed of two switch elements connected in series. In this configuration, there is an abnormality detection circuit which transmits an abnormality signal when a voltage at the connection point between the two switch elements becomes higher than a first reference voltage or becomes lower than a second reference voltage at the time of stopping operation of the inverter circuit.

CITATION LIST

Patent Document

Patent Document 1: Japanese Laid-Open Patent Publication No. 2019-110720.
Patent Document 2: Japanese Laid-Open Patent Publication No. 2013-243871.

SUMMARY OF THE INVENTION

Problem to be Solved by the Invention

However, the technology proposed in Patent Document 1 is for, when a detected voltage value has changed relative to a predetermined threshold value, determining that failure has occurred (detecting an abnormality), and this technology is not for detecting a minute leakage current caused by main-withstand-voltage deterioration of a semiconductor switching element. Meanwhile, in the technology proposed in Patent Document 2, the voltage at the connection point in the inverter circuit formed by connecting the semiconductor switching elements in series is determined according to only the balance between a voltage-detecting voltage division resistance connected to the connection point and a leakage current of each of the semiconductor switching elements. Thus, in view of a realistic condition that leakage currents of normal semiconductor switching elements include a negligibly small leakage current, a situation occurs in which the voltage at the connection point in a normal case converges to be approximate to zero owing to dominance of a leakage current of the voltage division resistance. Therefore, normality and abnormality cannot be highly accurately distinguished. Furthermore, in view of a circumstance in which the leakage current of a semiconductor switching element nonlinearly changes according to the voltage applied thereto, it is difficult to ensure a design margin of a reference voltage for distinguishing normality and abnormality in the field of products in which a main circuit voltage has a large fluctuation width. As a result, a problem arises also in that highly accurate detection of a leakage current cannot be realized.

The present disclosure has been made to solve the above problems, and an object of the present disclosure is to provide a power conversion device that can highly accurately determine main-withstand-voltage deterioration of a semiconductor switching element.

Means to Solve the Problem

A power conversion device according to the present disclosure is a power conversion device including: an arm pair composed of a first semiconductor switching element and a second semiconductor switching element such that, with one of plus and minus terminals for DC being defined as a first polarity terminal and with another one of the plus and minus terminals being defined as a second polarity terminal, the first semiconductor switching element is connected between the first polarity terminal and an arm midpoint and the second semiconductor switching element is connected between the arm midpoint and the second polarity terminal; and a semiconductor drive control unit which has an abnormality detection unit and a gate control unit and which controls drive of the first semiconductor switching element and the second semiconductor switching element. The abnormality detection unit has: a third resistor group connected in parallel to the first semiconductor switching element and having at least one resistor; a second resistor group including a series unit of a plurality of resistors and connected in parallel to the second semiconductor switching element so as to divide a voltage applied to the second semiconductor switching element; a reference voltage generation circuit which generates a first reference voltage obtained by dividing a voltage between the first polarity terminal and the second polarity terminal and a second reference voltage different from the first reference voltage, the second reference voltage having been obtained by dividing the voltage between the first polarity terminal and the second polarity terminal; and an abnormality determination unit which, after the power conversion device stops power conversion operation, compares a detection voltage as a voltage obtained through the voltage division by the second resistor group and each of the first reference voltage and the second reference voltage, and determines whether or not the first semiconductor switching element or the second semiconductor switching element has sustained main-withstand-voltage deterioration.

Effect of the Invention

The present disclosure makes it possible to provide a power conversion device that can highly accurately determine main-withstand-voltage deterioration of a semiconductor switching element.

DESCRIPTION OF EMBODIMENTS

Embodiment 1

Figure 1:
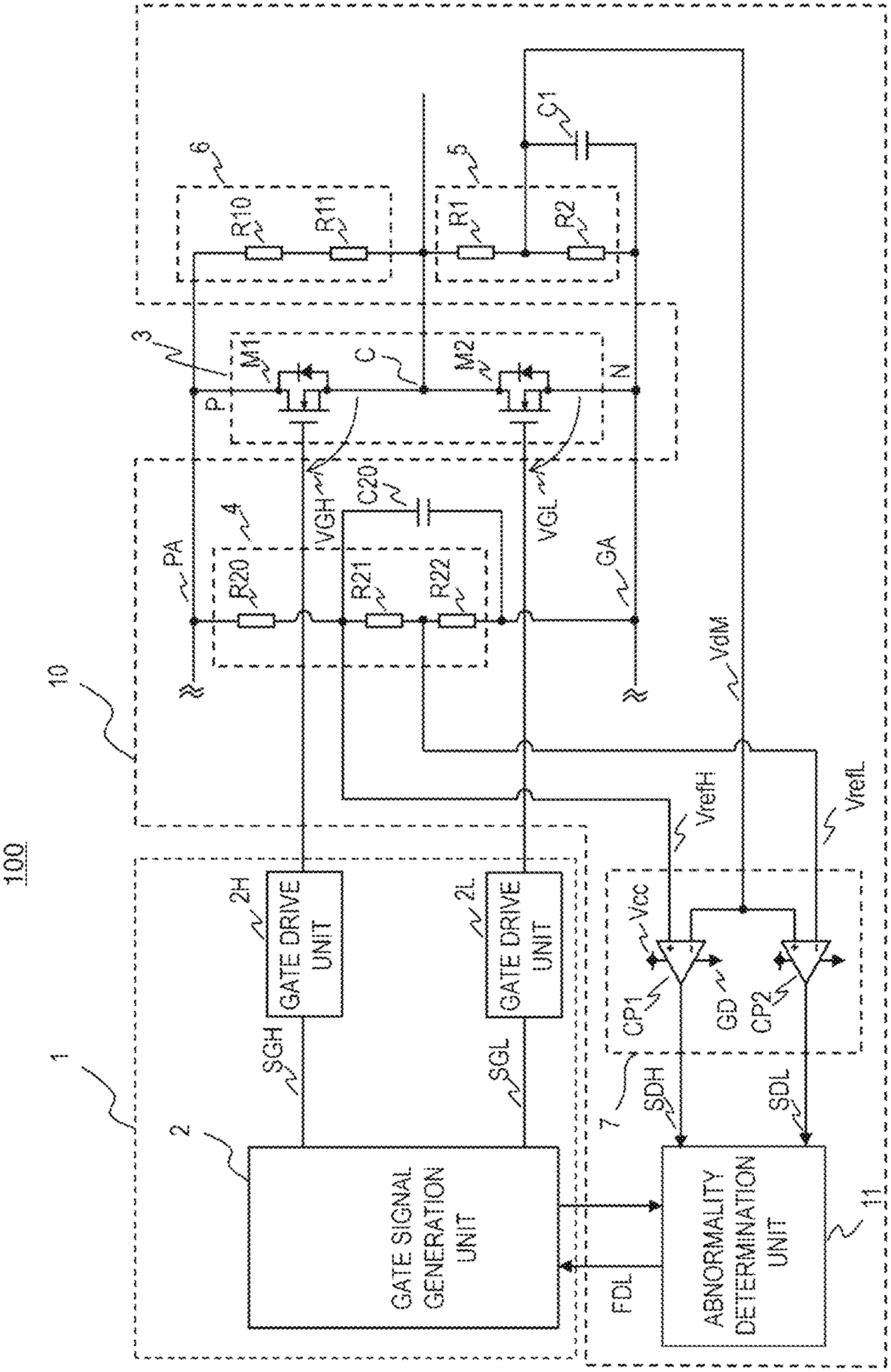
FIG. 1 shows a configuration of a power conversion device according to embodiment 1.

Hereinafter, embodiments will be described with reference to the drawings. In the following description, the same constituents or corresponding constituents are described while being denoted by the same reference characters. Also, in the following description, an element state where the device is not operated any more is defined as a "failure", and a state where an element is operated but has sustained deterioration and no longer satisfies required specifications is defined as "deterioration". Regarding such "deterioration", in a case where elements have been subjected to tests (have been screened) before being shipped, elements having been confirmed to satisfy required specifications, qualities, and a reliability goal in the various tests are targets.

FIG. 1 is a configuration diagram showing a configuration of a power conversion device according to embodiment 1. The power conversion device includes an arm pair (leg circuit) 3 composed of a first semiconductor switching element M1 forming an upper arm and a second semiconductor switching element M2 forming a lower arm, the semiconductor switching elements being connected in series between a positive potential PA and a negative potential GA for a DC power supply (not shown). Here, as an example of the power conversion device, a single-phase inverter configured with a single arm pair is shown for simplification. The arm pair 3 has an arm midpoint C as the connection point between a positive terminal P and a negative terminal N and between the first semiconductor switching element M1 and the second semiconductor switching element M2.

ON/OFF operation of each of the first semiconductor switching element M1 and the second semiconductor switching element M2 is controlled through application of a voltage between a gate and a source of the semiconductor switching element by a corresponding one of a gate drive unit 2H and a gate drive unit 2L on the basis of a corresponding one of ON/OFF command signals SGH and SGL generated by a gate signal generation unit 2. Here, a unit composed of the gate signal generation unit 2, the gate drive unit 2H, and the gate drive unit 2L is referred to as a gate control unit 1. As typical constituents of each of the gate drive unit 2H and the gate drive unit 2L, there are: an isolation communication unit such as a photocoupler, a level shifter, or a pulse transformer for isolating the corresponding one of the ON/OFF command signals SGH and SGL; a drive adjustment unit such as a buffer for amplifying an isolated signal obtained by the isolation or a gate resistor for adjusting switching characteristics; and a short-circuit protection unit which detects short-circuit in the corresponding one of the first semiconductor switching element M1 and the second semiconductor switching element M2 and safely performs interruption.

A first resistor group 4 (also referred to as "reference voltage generation circuit 4") formed by connecting at least three resistors in series is provided between the positive potential PA and the negative potential GA for the DC power supply. Here, an example in which three resistors R20, R21, and R22 are connected in series is described.

A second resistor group 5 formed by connecting two or more resistors in series is provided in parallel to the second semiconductor switching element M2 on the lower arm. Here, a resistor group in which two resistors R1 and R2 are connected in series is shown as an example of the second resistor group 5. Likewise, a third resistor group 6 including one or more resistors is provided in parallel to the first semiconductor switching element M1 on the upper arm. Here, a resistor group in which two resistors R10 and R11 are connected in series is shown as an example of the third resistor group 6. The configurations of the resistor groups in the present disclosure are not limited to those shown in the drawings, and the number of resistors connected in series may be increased.

A filter capacitor for stabilizing reference potentials VrefH and VrefL generated through voltage division is preferably provided between the negative potential GA and the connection point between resistors in the first resistor group 4. Here, an example in which a filter capacitor C20 is provided between the negative potential GA and the connection point between the resistors R20 and R21 is described. In addition, a filter capacitor for eliminating a high-frequency noise superimposed on a detection voltage VdM generated through voltage division may be provided as necessary between the negative potential GA and the connection point between the resistors in the second resistor group 5. Here, an example in which a filter capacitor C1 is provided between the negative potential GA and the connection point between the resistor R1 and the resistor R2 is described.

Regarding reference voltages for use in a voltage range comparator 7, voltages generated through voltage division by the resistors in the first resistor group 4 are used as the reference voltages. In this example, a first reference voltage VrefH is used as a reference voltage in a comparator CP1, and a second reference voltage VrefL different from the first reference voltage VrefH is used as a reference voltage in a comparator CP2. The voltage range comparator 7 is for generating signals for determining whether the detection voltage VdM generated through voltage division by the resistors in the second resistor group 5 is within a range between the reference voltages as two different voltages (VrefL<VdM<VrefH). Regarding these signals, the voltage range comparator 7 in the present embodiment is configured to: set an output SDH of the comparator CP1 to a Hi-output in the case of VdM<VrefH; and set an output SDL of the comparator CP2 to a Hi-output in the case of VrefL<VdM. Therefore, the output SDH is set to a Lo-output in the case of VdM≥VrefH, and the output SDL is set to a Lo-output in the case of VrefL≥VdM.

After ON/OFF operations of the semiconductor switching elements are stopped, an abnormality determination unit 11 compares the detection voltage VdM and each of the first reference voltage VrefH and the second reference voltage VrefL on the basis of the output results from the voltage range comparator 7. Then, the abnormality determination unit 11 determines, in the case of VrefL≥VdM or VAM≥VrefH, that the first semiconductor switching element M1 or the second semiconductor switching element M2 has sustained main-withstand-voltage deterioration. Then, the abnormality determination unit 11 outputs a main-withstand-voltage abnormality signal FDL to the gate signal generation unit 2, and furthermore, sends an alert.

As described above, an abnormality detection unit 10 includes the first resistor group (reference voltage generation circuit) 4, the second resistor group 5, the third resistor group 6, the voltage range comparator 7, and the abnormality determination unit 11. Here, a unit composed of the gate control unit 1 and the abnormality detection unit 10 is referred to as a semiconductor drive control unit 100.

For simplification, the only arm pair shown in FIG. 1 is the arm pair 3 in which the first semiconductor switching element M1 and the second semiconductor switching element M2 have been connected in series. However, the present disclosure is also applicable to a power conversion device including a plurality of arm pairs. For example, an H-bridge circuit including two arm pairs in parallel or a three-phase inverter including three arm pairs in parallel, may be used.

Method for Detecting Main-Withstand-Voltage Deterioration

Figure 2:
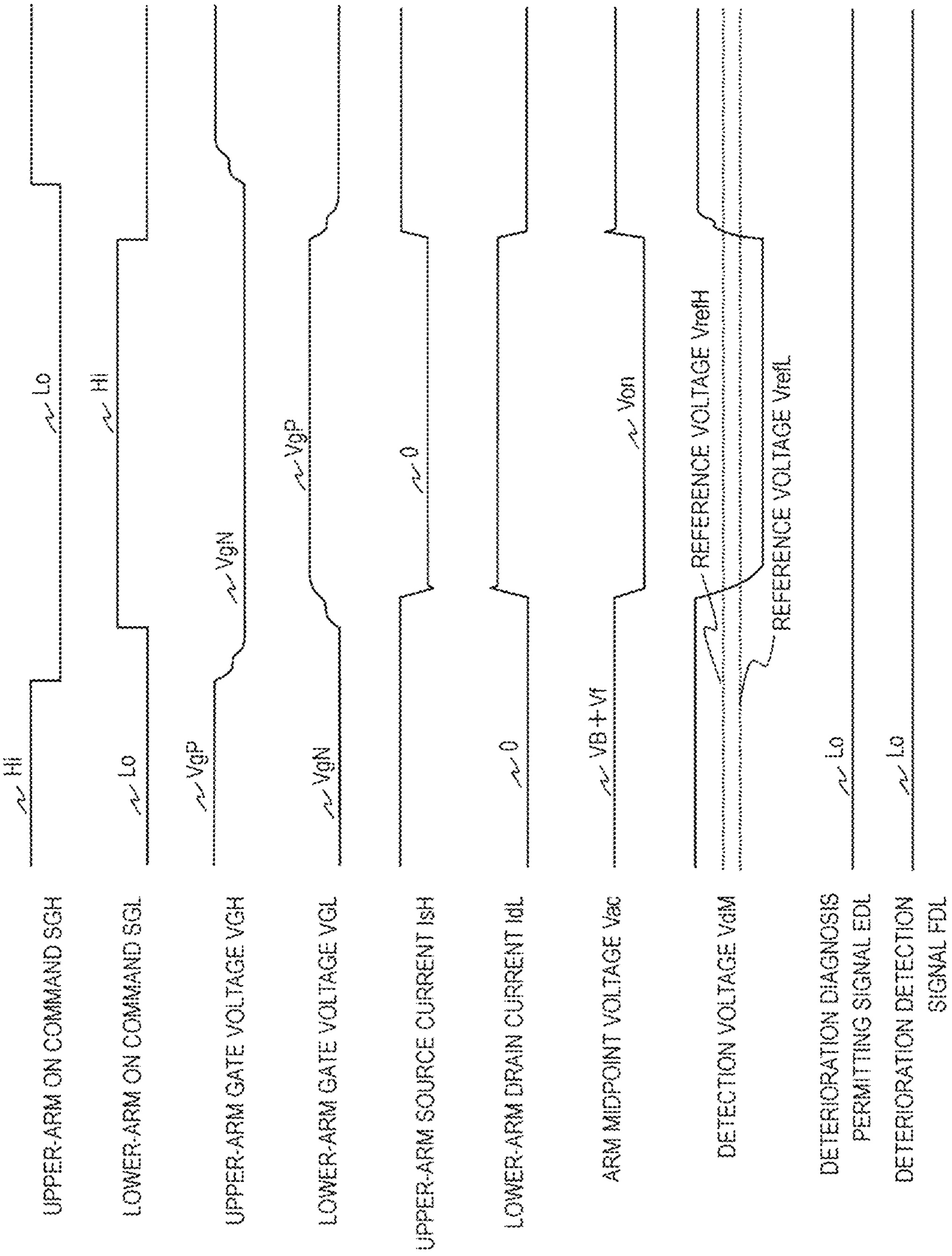
FIG. 2 is a first timing chart for explaining operation of the power conversion device according to embodiment 1.

Hereinafter, a method for detecting main-withstand-voltage deterioration will be specifically described with reference to timing charts regarding signals. The main-withstand-voltage deterioration refers to a state where a leakage current as a current flowing between main terminals of a semiconductor switching element at the time of turning off the semiconductor switching element while a voltage is being applied between the main terminals, increases owing to deterioration of the semiconductor switching element so that required specifications are not satisfied any more. Even when the semiconductor switching element is in a state of sustaining such main-withstand-voltage deterioration, ON/OFF operation thereof can be normally performed for a while. However, in the near future, the leakage current further increases, whereby normal ON/OFF operation becomes unable to be performed. FIG. 2 is a timing chart regarding signals, at the time of switching operation in a state where the semiconductor switching elements are sound. Gate voltages VGH and VGL are applied to the gates of the first semiconductor switching element M1 on the upper arm and the second semiconductor switching element M2 on the lower arm on the basis of an upper-arm ON command SGH and a lower-arm ON command SGL generated by the gate signal generation unit 2, respectively. Consequently, the first semiconductor switching element M1 and the second semiconductor switching element M2 perform ON/OFF operations. Regarding the ON/OFF operations, a state where synchronous rectification is performed when a current IsH flows to a diode provided in parallel to the first semiconductor switching element is presented as an example of the state on the upper arm side, and a state where a drain current IdL in the forward direction of the second semiconductor switching element is conducted/interrupted through ON/OFF operation thereof is presented as an example of the state on the lower arm side. At this time, a voltage Vac at the arm midpoint C as the connection point between the first semiconductor switching element M1 and the second semiconductor switching element M2 changes between upper and lower limits which are respectively: VB+Vf obtained by adding a forward voltage Vf of each diode to a voltage VB between the positive potential PA and the negative potential GA; and an ON voltage Von based on the ON resistance of each semiconductor switching element.

The detection voltage VdM generated through voltage division by the second resistor group 5 repetitively takes a state of being higher than the reference voltage VrefH designed according to the resistance value of the first resistor group 4 or a state of being lower than the reference voltage VrefL designed according to said resistance value. When the second semiconductor switching element M2 is turned on or off, the detection voltage VdM is changed between these states. Main-withstand-voltage deterioration of neither of the semiconductor switching elements can be detected from the voltage Vac at the arm midpoint C in such a switching state. Therefore, a deterioration diagnosis permitting signal EDL is kept in a Lo-state inside the abnormality determination unit 11 so as to stop detection of main-withstand-voltage deterioration. Consequently, the deterioration detection signal FDL is kept in a Lo-state, whereby a Hi-state indicating that main-withstand-voltage deterioration has occurred is prevented from being erroneously outputted at the time of the switching operation.

Figure 3:
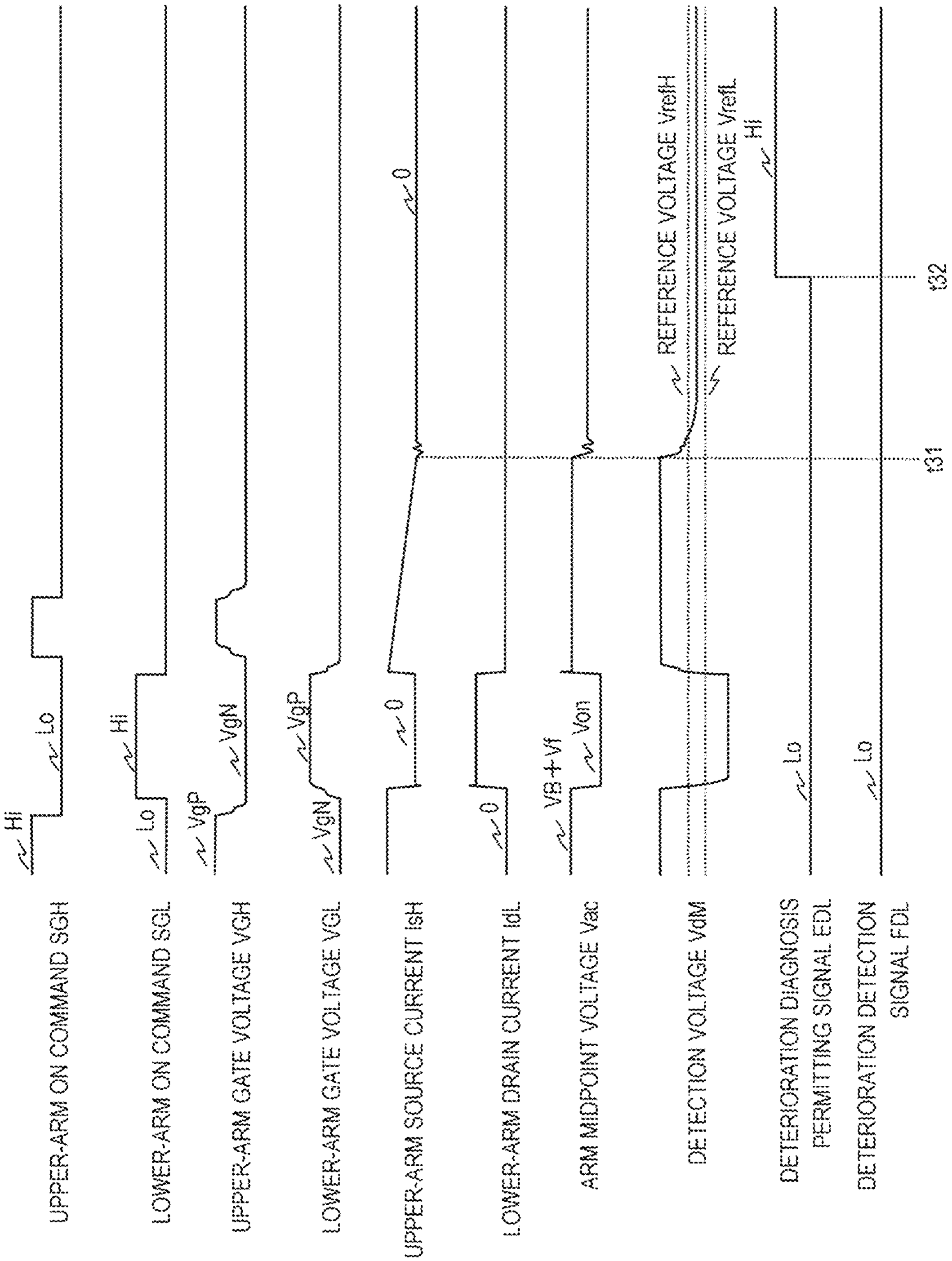
FIG. 3 is a second timing chart for explaining the operation of the power conversion device according to embodiment 1.

FIG. 3 is a timing chart regarding signals, from a timing immediately preceding stoppage of the ON/OFF operations of the semiconductor switching elements to a timing subsequent to the stoppage in the state where the semiconductor switching elements are sound. This timing chart corresponds to a state where both semiconductor switching elements on the upper and lower arms are turned off, the state being obtained by transition from the switching operation state shown in FIG. 2. When both semiconductor switching elements on the upper and lower arms are turned off, the source current on the upper arm gradually decreases and reaches zero at a time point t31. After resonance occurs owing to a main circuit inductance and parasitic capacitances of the semiconductor switching elements, the source current converges to be in a static zero state. Accordingly, the arm midpoint voltage Vac converges to be approximate to VB/2, and the value resulting from the convergence is determined according to leakage currents that are parasitic in the first semiconductor switching element M1 and the second semiconductor switching element M2. Accordingly, the detection voltage VdM converges to be a value between the reference voltages VrefL and VrefH. At a time point t32 sufficiently after the arm midpoint voltage Vac settles to be in the steady state, the deterioration diagnosis permitting signal EDL is set to be in a Hi-state inside the abnormality determination unit 11 so as to enable detection of main-withstand-voltage deterioration. However, since the reference voltages are designed such that the detection voltage VdM is in a relationship represented as VrefL<VdM<VrefH in the state where the semiconductor switching elements are sound, the deterioration detection signal FDL is, even after the time point t32, in a Lo-state where no deterioration has been detected.

Figure 4:
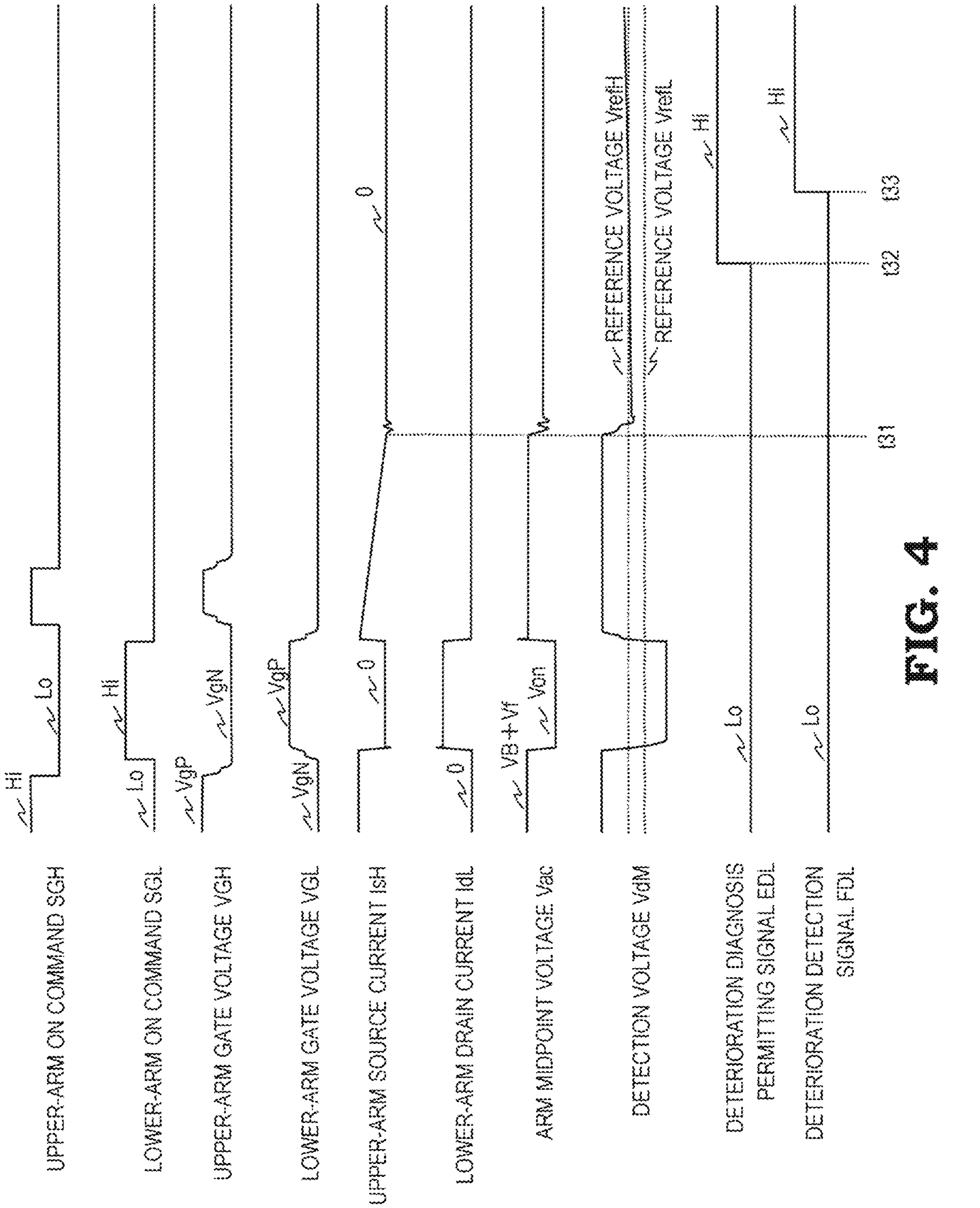
FIG. 4 is a third timing chart for explaining the operation of the power conversion device according to embodiment 1.

FIG. 4 is a timing chart regarding signals, after the ON/OFF operations of the semiconductor switching elements are stopped in a state where the first semiconductor switching element M1 has sustained main-withstand-voltage deterioration. In comparison to FIG. 3, the detection voltage VdM obtained subsequently to stoppage of the ON/OFF operations of the semiconductor switching elements exceeds the reference voltage VrefH. Consequently, the comparator CP1 in the voltage range comparator 7 determines that a state of VdM≥VrefH has been obtained. Thus, at a time point t33, the abnormality determination unit 11 changes the deterioration detection signal FDL to a Hi-output indicating that main-withstand-voltage deterioration has been detected. The detection voltage VdM obtained subsequently to stoppage of the ON/OFF operations exceeds the reference voltage VrefH according to the following principle. That is, the exceeding occurs because the combined resistance of the total resistance value of the third resistor group 6 and a parasitic resistance value obtained by conversion from the leakage current of the first semiconductor switching element M1 and the voltage applied thereto becomes lower than the combined resistance of the total resistance value of the second resistor group 5 and a parasitic resistance value obtained by conversion from the leakage current of the second semiconductor switching element M2 and the voltage applied thereto. The reference voltage VrefH and the reference voltage VrefL can be designed according to ranges of a detection-target leakage current value and a parasitic leakage current value of a sound product.

Here, a criterion for determining whether or not main-withstand-voltage deterioration has occurred may be set to a time that the detection voltage VdM takes to become a voltage other than a voltage between the reference voltages VrefL and VrefH. That is, when the time taken to obtain a voltage other than a voltage between both reference voltages is long, it is determined that main-withstand-voltage deterioration has not occurred, and meanwhile, when said time is short, it is determined that main-withstand-voltage deterioration has occurred. Alternatively, the criterion for the determination may be set to the change amount of the detection voltage VdM per unit time when the detection voltage VdM becomes a voltage other than a voltage between the reference voltages VrefL and VrefH. That is, when the change amount is small, it is determined that main-withstand-voltage deterioration has not occurred, and meanwhile, when the change amount is large, it is determined that main-withstand-voltage deterioration has occurred.

Meanwhile, when the second semiconductor switching element M2 has sustained main-withstand-voltage deterioration, the combined resistance of the total resistance value of the second resistor group 5 and a parasitic resistance value obtained by conversion from the leakage current of the second semiconductor switching element M2 and the voltage applied thereto becomes lower than the combined resistance in a state where main-withstand-voltage deterioration has not occurred. Therefore, the detection voltage VdM obtained subsequently to stoppage of the ON/OFF operations becomes lower than the reference voltage VrefL. Consequently, it can be detected that the second semiconductor switching element M2 has sustained main-withstand-voltage deterioration. By setting the combined resistance value of the second resistor group 5 and the combined resistance value of the third resistor group 6 to be equal to each other, main-withstand-voltage deterioration of the first semiconductor switching element M1 and main-withstand-voltage deterioration of the second semiconductor switching element M2 can be detected with equal accuracies.

Method for Designing Resistance Values of Second Resistor Group and Third Resistor Group The resistance values of the second resistor group 5 and the third resistor group 6 are designed according to the following method. That is, the designing is performed such that the value of a leakage current flowing according to the combined resistance value of each of the resistor groups becomes larger than the value of a leakage current (the value of a current flowing when the corresponding semiconductor switching element is turned off) that is parasitic between the main terminals of the semiconductor switching element (between the terminals, of the semiconductor switching element, through which a main current flows) in a state where each of the first semiconductor switching element M1 and the second semiconductor switching element M2 is sound, e.g., an initial state at the time of shipping. For example, the following method is conceivable. That is, in view of leakage currents that are set as main-withstand-voltage screening conditions at the time of shipping of the semiconductor switching elements, detection-target leakage current values obtained by adding a margin for preventing erroneous detection to the set leakage currents are determined, and combined resistance values of the respective resistor groups are determined such that the detection-target leakage current values can be accurately detected.

Excessively large leakage currents in the second resistor group 5 and the third resistor group 6 lead to decrease in the fluctuation width of the detection voltage VdM due to increase in the leakage currents of the first semiconductor switching element M1 and the second semiconductor switching element M2. Consequently, the detection accuracy becomes poor. Meanwhile, excessively small leakage currents in the second resistor group 5 and the third resistor group 6 lead to significant variation in the detection voltage VdM relative to the leakage currents, of the semiconductor switching elements, that are each within a normal range. Consequently, a problem arises in that: in the case of normality, it is determined that an abnormality has occurred;

or no abnormality can be detected. For example, when the leakage current of the first semiconductor switching element M1 is at a negligible level and the leakage current of the second semiconductor switching element M2 is at a level corresponding to the level under the screening conditions at the time of shipping, a situation is attained in which the detection voltage VdM obtained when both of these semiconductor switching elements are turned off is unevenly on the lower arm side in a state where the main withstand voltages thereof are sound. Thus, the resistance values of the second resistor group 5 and the third resistor group 6 are preferably designed so as not to erroneously detect this situation.

Timing of Detecting Main-Withstand-Voltage Deterioration

Detection of main-withstand-voltage deterioration of each of the first semiconductor switching element M1 and the second semiconductor switching element M2 is performed in a state where: both of these semiconductor switching elements are turned off; and the output voltage at the arm midpoint C as the point of series connection therebetween converges to be a steady value. Specifically, the detection can be performed at the time of start or stoppage of the device, during coasting of the device, or the like. It is noted that each main-withstand-voltage leakage current increases according to the junction temperature (the temperature of a joined portion) of the corresponding element, and thus withstand-voltage deterioration can be determined most highly accurately through detection at a timing that is immediately subsequent to stoppage of operation of the device and at which the junction temperature of the semiconductor switching element is higher than a surrounding environment temperature.

Meanwhile, the junction temperature of the switching element is not high at the time of start of the device. Thus, the power conversion device is operated so as to increase the junction temperature until this temperature enters a state of being higher than the environmental temperature, and detection is performed at the timing of obtaining this state. Consequently, main-withstand-voltage deterioration can be highly accurately determined.

Operation after Detection of Deterioration

Figure 5:
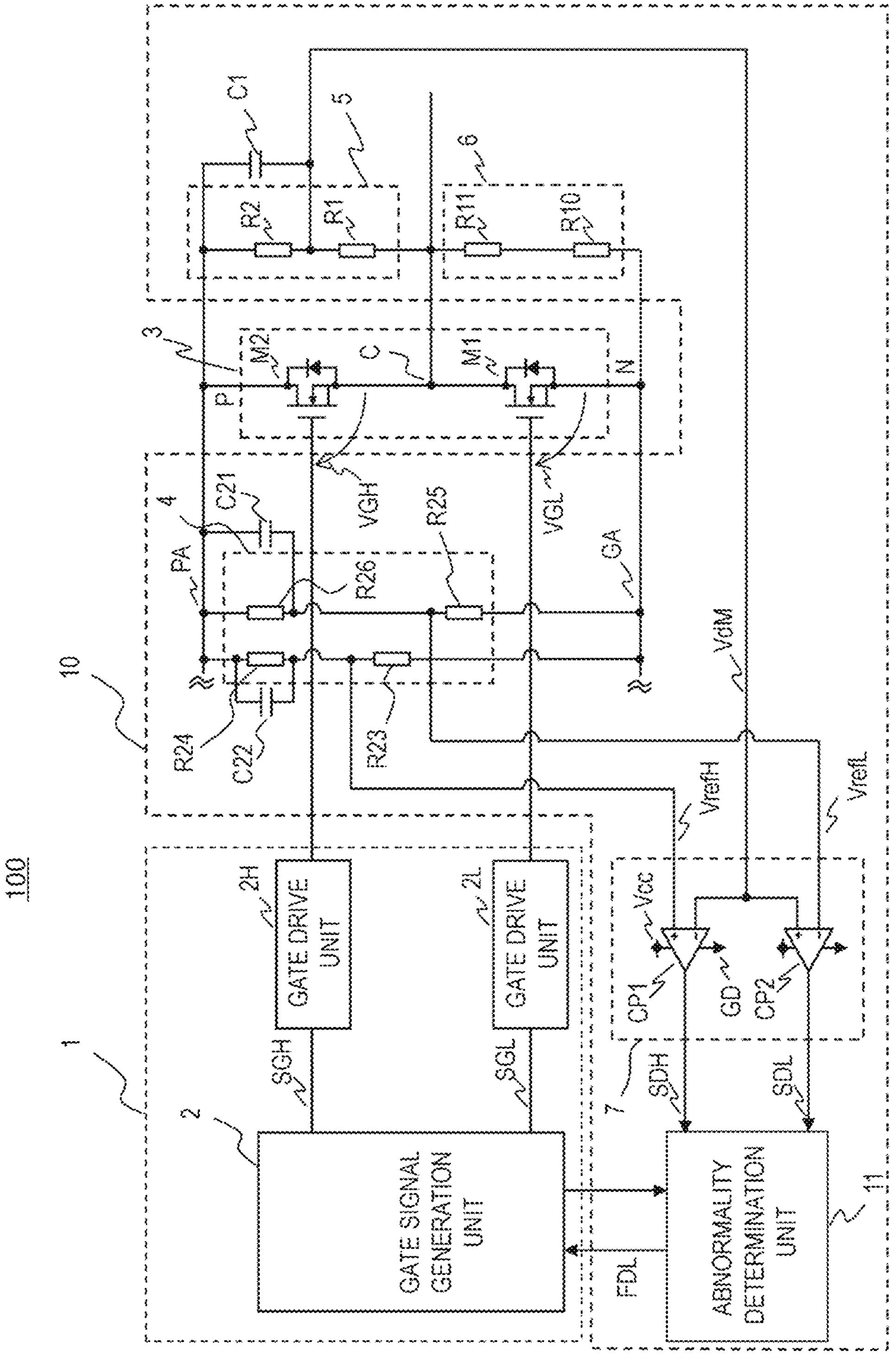
FIG. 5 shows another configuration of the power conversion device according to embodiment 1.

When it is determined that either of the semiconductor switching elements has sustained main-withstand-voltage deterioration, the abnormality determination unit 11 shown in FIG. 1 or FIG. 5 reports the abnormality to a receiver. For example, the device is provided with an abnormality lamp, and, when it is determined that main-withstand-voltage deterioration has occurred, the abnormality lamp is lit. When the abnormality lamp is lit, a measure may be taken to immediately stop the device. Alternatively, since the abnormality lamp is lit when it is determined that the deterioration has occurred before the switching element is broken, setting may be performed so as to: continue operation until the next occasion of stoppage of the device, even though the abnormality lamp is lit; and replace the semiconductor switching element with another one when the device is stopped.

Alternatively, when it is determined that either of the semiconductor switching elements has sustained main-withstand-voltage deterioration, operation of the power conversion device may be changed to decrease the load on the semiconductor switching element in order to temporarily elongate the lifespan of the semiconductor switching element. For example, the operation method is changed to a method that includes, when the original modulation type of the inverter is three-phase modulation, changing the modulation type to two-phase modulation, decreasing the carrier frequency in switching, or otherwise decreasing the number of times of switching. Alternatively, it is also conceivable to mitigate stress by decreasing load current. In this manner, from a timing at which an abnormality in either of the semiconductor switching elements is detected and an alert is displayed, the lifespan of the switching element is elongated as a temporary measure, whereby the device can be operated without being stopped. Thus, the device can be operated according to a preset operation schedule without any down-time.

Advantageous Effect of Configuration in which Reference Voltages are Changed According to Main Circuit Voltage In embodiment 1, the first reference voltage VrefH and the second reference voltage VrefL for use in the voltage range comparator 7 are generated through voltage division by the resistors in the first resistor group 4 provided between the main circuit positive potential PA and the main circuit negative potential GA. Therefore, when a main circuit voltage has decreased, the range between the reference voltages (VrefH-VrefL) within which the abnormality determination unit 11 determines that normality is maintained is changed to be narrowed. In contrast, when the main circuit voltage has increased, the range between the reference voltages is changed to be widened. This configuration is employed in view of the fact that a main-withstand-voltage leakage current nonlinearly increases according to increase in an applied voltage. This configuration makes it possible to: prevent the detection accuracy from becoming poor as a result of nonlinear decrease in the leakage current when the main circuit voltage has decreased; and prevent erroneous detection of an abnormality in the case of normality as a result of nonlinear increase in the leakage current when the main circuit voltage has increased. Consequently, as compared to the conventional configurations, a minute leakage current can be more highly accurately detected, and therefore, the lifespan of the semiconductor switching element can be elongated to a larger extent.

FIG. 5 is a block diagram showing another configuration of the power conversion device according to embodiment 1. In FIG. 1, the voltage obtained through the voltage division by the second resistor group 5 provided in parallel to the second semiconductor switching element M2 forming the negative-side arm is used as the detection voltage VdM. Meanwhile, in the configuration in FIG. 5, the semiconductor switching element forming the negative-side arm is the first semiconductor switching element M1, the semiconductor switching element forming the positive-side arm is the second semiconductor switching element M2, the second resistor group 5 is provided in parallel to the second semiconductor switching element M2, and the voltage obtained through the voltage division by the second resistor group 5 is used as the detection voltage VdM.

Also, the configuration shown in FIG. 1 is a configuration in which the first reference voltage VrefH and the second reference voltage VrefL are generated by the reference voltage generation circuit 4 as a first resistor group composed of three resistors connected in series. Meanwhile, in the configuration shown in FIG. 5, the first resistor group 4 as a reference voltage generation circuit is composed of two resistor-series units which are: a series unit of a resistor R23 and a resistor R24 which are connected between the positive potential PA and the negative potential GA, and a series unit of a resistor R25 and a resistor R26 which are connected between the positive potential PA and the negative potential GA. In this configuration, the first reference voltage VrefH is generated through voltage division by the series unit of the resistor R23 and the resistor R24, and the second reference voltage VrefL is generated through voltage division by the series unit of the resistor R25 and the resistor R26. In addition, a filter capacitor C22 and a filter capacitor C21 are respectively provided in parallel to the resistor R24 and the resistor R26 in order to stabilize the reference voltages. As is known from the above description, the configuration of the reference voltage generation circuit 4 may be any configuration as long as the reference voltage generation circuit 4 is configured to divide the voltage between the positive potential PA and the negative potential GA and generate a first reference voltage VrefH and a second reference voltage VrefL different from the first reference voltage VrefH.

In the case of the configuration in FIG. 5, the first reference voltage VrefH, the second reference voltage VrefL, and the detection voltage VdM are preferably set with a circuit in which the positive potential PA is used as a reference. In the configuration in FIG. 5 as well, the detection voltage VdM and each of the first reference voltage VrefH and the second reference voltage VrefL are compared, whereby it is possible to determine whether or not the first semiconductor switching element M1 or the second semiconductor switching element M2 has sustained main-withstand-voltage deterioration, in the same manner as in the configuration in FIG. 1.

As described above, the power conversion device according to embodiment 1 is a power conversion device including an arm pair composed of a first semiconductor switching element M1 and a second semiconductor switching element M2 such that, with one of plus and minus terminals PA and GA for DC being defined as a first polarity terminal and with another one of the plus and minus terminals PA and GA being defined as a second polarity terminal, the first semiconductor switching element M1 is connected between the first polarity terminal and an arm midpoint C and the second semiconductor switching element M2 is connected between the arm midpoint and the second polarity terminal. The power conversion device is configured such that there are: a third resistor group 6 connected in parallel to the first semiconductor switching element M1 and having at least one resistor; a second resistor group 5, as a series unit of a plurality of resistors, connected in parallel to the second semiconductor switching element M2 so as to divide a voltage applied to the second semiconductor switching element M2; a reference voltage generation circuit 4 which generates a first reference voltage VrefH obtained by dividing a voltage between the first polarity terminal and the second polarity terminal and a second reference voltage VrefL different from the first reference voltage VrefH, the second reference voltage VrefL having been obtained by dividing the voltage between the first polarity terminal and the second polarity terminal; and an abnormality determination unit 11 which, after ON/OFF operations of the first semiconductor switching element M1 and the second semiconductor switching element M2 are stopped, determines that the first semiconductor switching element M1 or the second semiconductor switching element M2 has sustained main-withstand-voltage deterioration, when a detection voltage VdM obtained through the voltage division by the second resistor group 5 is a voltage other than a voltage between the first reference voltage VrefH and the second reference voltage VrefL.

Consequently, it is possible to accurately detect a state where the first semiconductor switching element M1 or the second semiconductor switching element M2 has sustained main-withstand-voltage deterioration.

Embodiment 2

Figure 6:
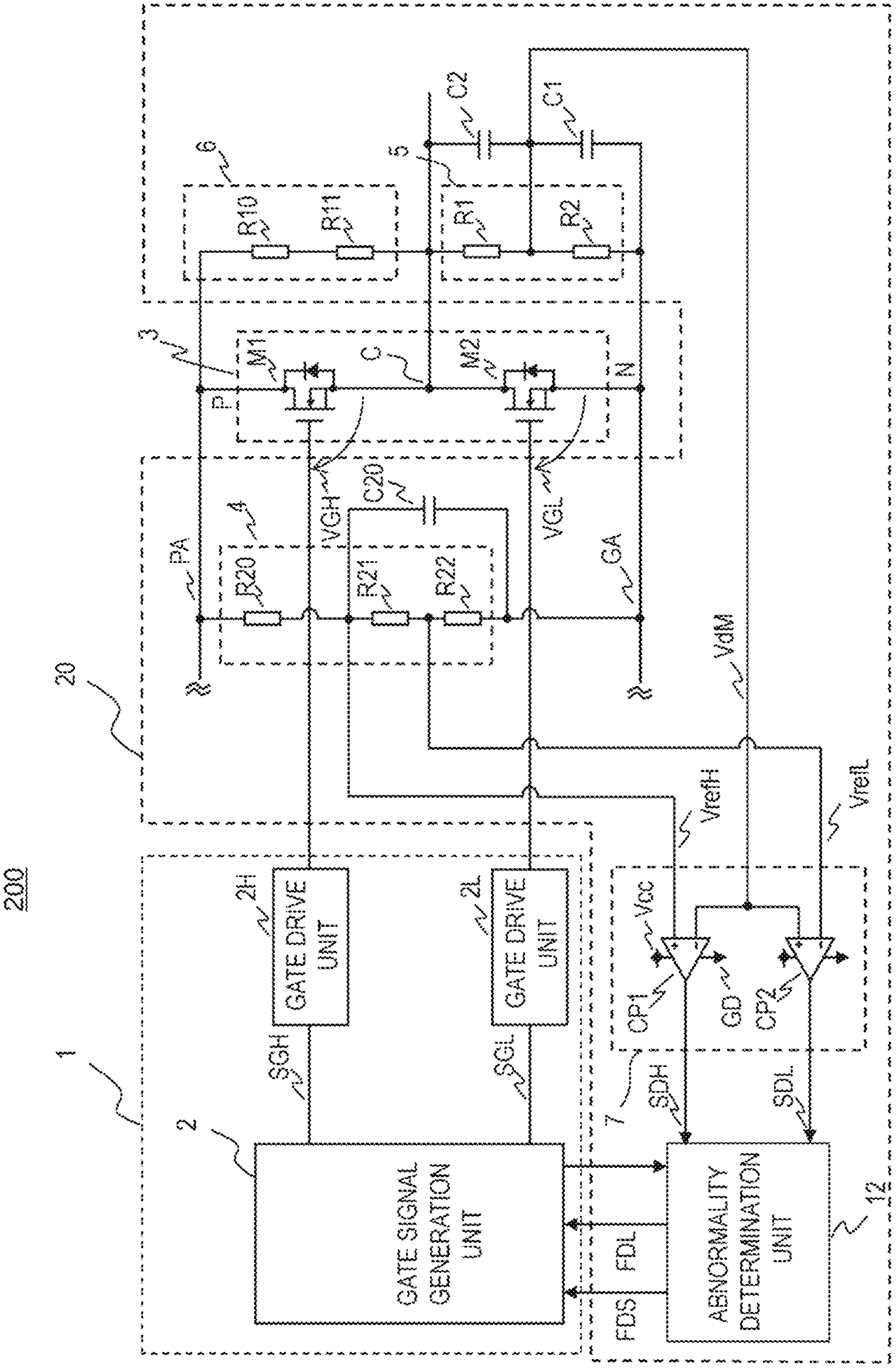
FIG. 6 shows a configuration of a power conversion device according to embodiment 2.

FIG. 6 is a configuration diagram showing a configuration of a power conversion device according to embodiment 2. In FIG. 6, a semiconductor drive control unit 200 is composed of an abnormality detection unit 20 and the gate control unit 1. Hereinafter, only differences between the abnormality detection unit 20 and the abnormality detection unit 10 in FIG. 1 will be described.

The abnormality detection unit 20 differs from the abnormality detection unit 10 in FIG. 1 in that an abnormality determination unit 12 is configured to further perform short-circuit detection or dead time detection by using the voltage range comparator 7 for use in detection of main-withstand-voltage deterioration. The short-circuit detection is for detecting a state where the first semiconductor switching element M1 and the second semiconductor switching element M2 are simultaneously energized, i.e., detection of occurrence of so-called arm short-circuit. The arm short-circuit is considered to be attributed to a circumstance such as erroneous operation due to noise, insufficiency in the dead times for the upper and lower arms, or failure of either of the semiconductor switching elements. The dead time detection is for detecting a delay time from the timing at which each of ON/OFF command signals is generated by the gate signal generation unit 1 to the timing at which the corresponding semiconductor switching element is actually turned on or off. A dead time is detected and corrected to an optimum dead time, whereby the output performance of the power conversion device can be improved.

The diagnosis of main-withstand-voltage deterioration described in embodiment 1 is for detecting a steady state after stoppage of the inverter, whereas the short-circuit detection and the dead time detection are for detecting a transient state at the time of switching. Therefore, the diagnosis of main-withstand-voltage deterioration does not require the detection circuit to have high responsivity, whereas the short-circuit detection and the dead time detection require high detection accuracy, Thus, the short-circuit detection and the dead time detection require the detection circuit to have responsivity, but do not require accuracy regarding a voltage amplitude. These requirements are mutually in a trade-off relationship. That is, in a case where the resistance value of the second resistor group 5 is increased such that the accuracy of detecting a leakage current for detecting main-withstand-voltage deterioration is made high, a problem arises in that, even when the filter capacitor C1 is omitted, the change time of the detection voltage VdM is elongated owing to minute parasitic capacitances of the comparators in the voltage range comparator 7, whereby the short-circuit detection and the dead time detection become slow.

The present embodiment 2 solves the above problem as follows. That is, with the second resistor group 5 being composed of the resistor R1 (also referred to as "first resistor") on the arm midpoint side and the resistor R2 (also referred to as "second resistor") connected in series to the resistor R1, a speed-increasing capacitor C2 (also referred to as "second capacitor") is provided in parallel to the resistor R1 on the arm midpoint side of the second resistor group 5. Thus, a configuration is attained in which a steady convergence value of the detection voltage VdM is determined according to the ratio between the resistances in the second resistor group 5, whereas a transient convergence value of the detection voltage VdM is determined according to the ratio between the capacitances of the speed-increasing capacitor C2 and the filter capacitor C1 (first capacitor) (with input parasitic capacitances of the comparators CP1 and CP2 also being considered as necessary). Consequently, the accuracy of detecting main-withstand-voltage deterioration, and detection delays in the short-circuit detection and the dead time detection, can be designed so as to be optimum. Specifically, a resistance value Rs1 of the resistor R1 on the arm midpoint side of the second resistor group 5, a resistance value Rs2 of the resistor R2 connected in series to the resistor R1, a capacitance Cs1 of the filter capacitor C1 connected in parallel to the resistor R1, and a capacitance Cs2 of the speed-increasing capacitor C2 connected in parallel to the resistor R2 are set to satisfy $Rs2/(Rs1+Rs2)<Cs2/(Cs1+Cs2)$, whereby favorable adaptation to different detection events can be achieved. That is, a detection voltage at any of the times of transition such as the time of short-circuit and the time of dead time detection is induced to be quickly changed to a low level of voltage, for short-circuit detection or dead time detection, that is set according to the voltages of the capacitors, and meanwhile, a subsequent steady detection voltage can be set to a high level of voltage, for diagnosis of main-withstand-voltage deterioration, that is set according to the ratio between the resistances. By doing so, short-circuit detection and dead time detection requiring high speed, and diagnosis of main-withstand-voltage deterioration requiring high accuracy, can be suitably realized with a common determination circuit.

Figure 7:
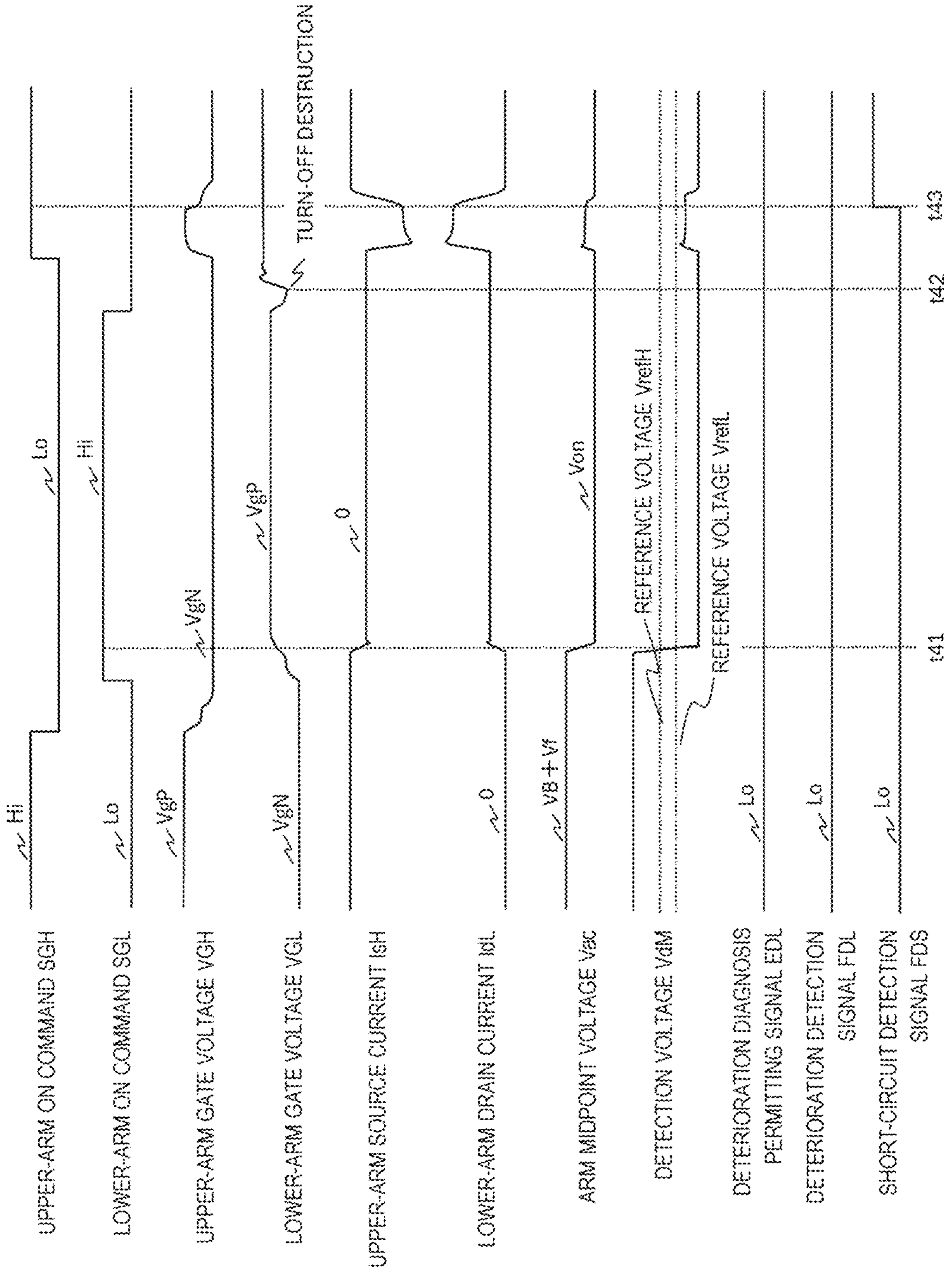
FIG. 7 is a timing chart for explaining operation of the power conversion device according to embodiment 2.

Hereinafter, a method for the dead time detection and the short-circuit detection will be described with reference to a timing chart in FIG. 7. In general, a time (turn-on time ton) required for turn-on for changing from an OFF state to an ON state and a time (turn-off time toff) required for turn-off for changing from the ON state to the OFF state are present for a semiconductor switching element. When the gate resistance value of the semiconductor switching element increases, the turn-on time ton and the turn-off time toff are elongated. The turn-on time ton and the turn-off time toff are elongated or shortened also owing to variation in electrical characteristics such as gate threshold voltages among semiconductor switching elements and operation conditions such as a junction temperature. Considering the elongation and the shortening, a dead time as an instruction period during which an OFF state should be maintained is sufficiently provided for each of the ON command signals SGH and SGL, for the upper and lower arms, that are generated by the gate signal generation unit 2. Meanwhile, owing to the presence of the dead time, output properties of the power conversion device decrease, and thus control for detecting the actual turn-on time ton and turn-off time toff to optimize the dead time is sometimes applied. In the present embodiment 2, the voltage range comparator 7 for use in detection of main-withstand-voltage deterioration is utilized to detect a time point at which the detection voltage VdM has crossed the reference voltage VrefH or VrefL, to optimize the dead time. For example, in FIG. 7, after the ON command SGL for the lower arm is generated, the arm midpoint voltage Vac decreases. In association with this decrease, the detection voltage VM becomes lower than the reference voltage VrefL at a time point t41. By detecting the time point t41, a dead time from generation of the ON command to the actual change in the main terminal voltage can be detected. On the basis of the detected dead time, the ON command signals SGH and SGL, for the upper and lower arms, that are generated by the gate signal generation unit 2 are corrected, and a dead time amount is corrected. Consequently, output properties of the power conversion device can be improved.

Next, a method for the short-circuit detection will be described. FIG. 7 is based on a state where the second semiconductor switching element M2 is broken at a time point 142 during a turn-off operation on the lower arm so that the main withstand voltage is lost. In this case, the ON command signal SGH is subsequently transmitted to the upper arm as a corresponding arm so that the first semiconductor switching element M1 is turned on. At the timing of this turn-on, arm short-circuit occurs, whereby an excessively large current flows. As a result, unlike in a normal state where the arm midpoint voltage Vac increases to VB+Vf, the arm midpoint voltage Vac does not increase owing to current saturation of the semiconductor switching element M1. As a result, the detection voltage VdM remains lower than the reference voltage VrefL. That is, short-circuit can be detected from logical inconsistency between the detection voltage VdM and the ON command signal transmitted by the gate signal generation unit 2. As a result, the state of a short-circuit detection signal FDS is changed to a Hi-state at a time point 143 at which a filter delay in the abnormality determination unit 12 and the like have been reflected. In response to the change of the state of the short-circuit detection signal FDS to the Hi-state as a result of detection of the short-circuit by the abnormality determination unit 12, the gate signal generation unit 2 typically takes a measure to change the states of all the ON command signals to OFF states so as to stop operation of the power conversion device. Also, an OFF-gate resistance value at which short-circuit current is interrupted is increased, whereby overvoltage breakdown can be assuredly prevented.

The present embodiment 2 is based on a configuration in which, in order to increase the speed of short-circuit detection, VrefL is set as a determination reference voltage for use in short-circuit detection at the time of turning on the upper arm, and likewise, VrefH is set as a determination reference voltage for use in short-circuit detection at the time of turning on the lower arm. This configuration is for selecting, out of the choices which are determination reference voltages VrefL and VrefH, a preferable one for increasing the speed of short-circuit detection. The reason for this is as follows. Here, it is assumed that, in FIG. 6, a state where the first semiconductor switching element M1 on the upper arm is turned on subsequently to the time point t42 involves normal switching. In this case, the arm midpoint voltage Vac increases to VB+Vf through the normal switching. Meanwhile, in a case where VrefH is employed as a determination reference voltage, the determination reference value is exceeded at a later time point than in a case where VrefL is employed. That is, it takes time to determine that normal switching has occurred. Therefore, during the period before the determination, it is necessary to disable the short-circuit detection function or perform masking on a detection signal by using a low-pass filter. As a result, when short-circuit actually occurs, a longer delay time elapses before the short-circuit detection signal FDS is generated. Thus, the performance of protection from short-circuit decreases. Considering this drawback, it is preferable that: VrefL is set as a determination reference voltage for use in short-circuit detection at the time of turning on the upper arm; and VrefH is set as a determination reference voltage for use in short-circuit detection at the time of turning on the lower arm.

Embodiment 3

Figure 8:
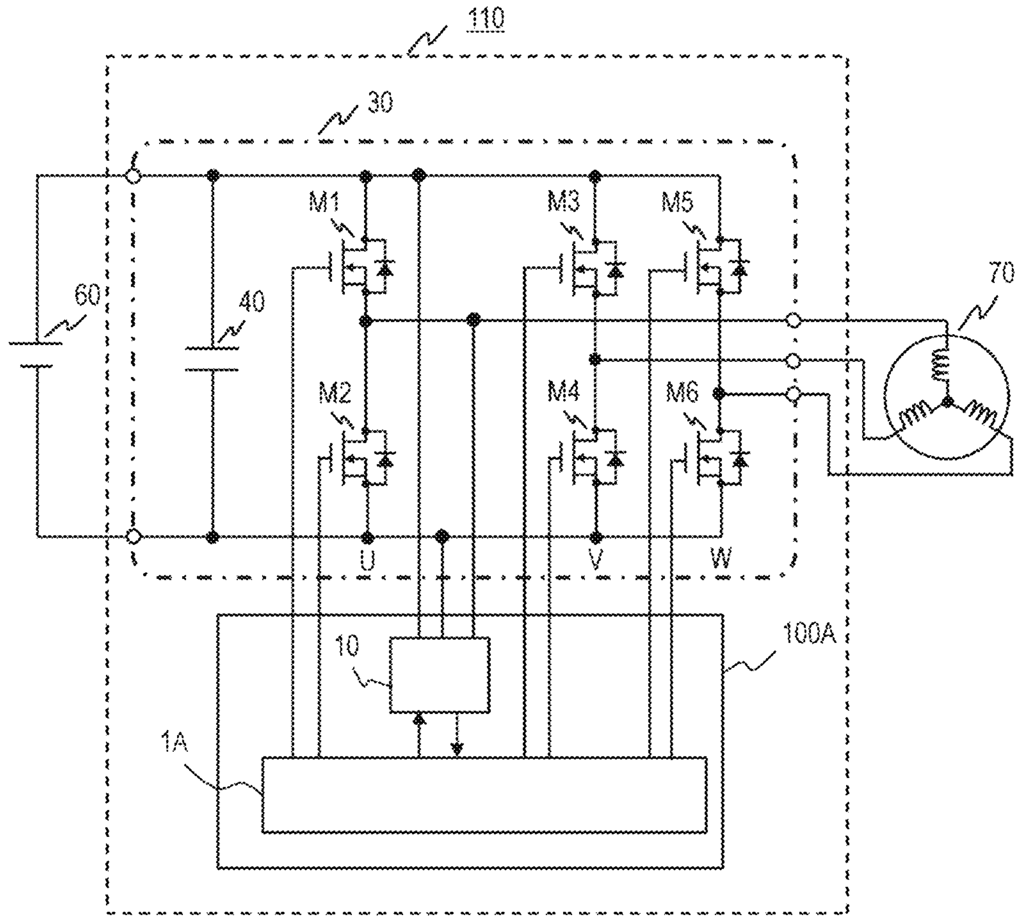
FIG. 8 shows a configuration of a power conversion device according to embodiment 3.

FIG. 8 is a circuit diagram showing a configuration of a power conversion device 110 according to embodiment 3. The power conversion device 110 is an inverter in which DC power from a DC power supply 60 is converted into three-phase AC power which is then supplied to an AC motor 70. The power conversion device 110 includes: a power converter 30 which has a plurality of semiconductor switching elements and which performs conversion into AC for three phases U, V, and W; and a semiconductor drive control unit 100A having a gate control unit 1A for driving each of the semiconductor switching elements in the power converter 30. The semiconductor drive control unit 100A includes an abnormality detection unit 10 which has the same configuration as that of the abnormality detection unit 10 in embodiment 1 and which is provided to an arm pair, for the U phase, composed of the first semiconductor switching element M1 and the second semiconductor switching element M2. No abnormality detection unit 10 is provided to a semiconductor switching element M3 and a semiconductor switching element M4 composing an arm pair for the V phase, or a semiconductor switching element M5 and a semiconductor switching element M6 composing an arm pair for the W phase.

In the present embodiment 3, the abnormality detection unit 10 having the same configuration as that of the abnormality detection unit 10 of the semiconductor drive control unit 100 mounted in the power conversion device according to embodiment 1 can detect main-withstand-voltage deterioration regardless of which element among the semiconductor switching elements composing the power converter 30 has sustained the deterioration. Consequently, an inexpensive power conversion device 110 in which elimination of a downtime can be realized is obtained.

Hereinafter, description will be given regarding the principle by which the single abnormality detection unit 10 provided for the U phase can detect main-withstand-voltage deterioration regardless of which element among the semiconductor switching elements composing the power converter 30 has sustained the deterioration. In general, the AC motor 70 has a high insulation characteristic of several hundreds of megaohms to several gigaohms or higher, and thus leakage current generated via the AC motor 70 is not dominant. Thus, such leakage current is not a factor for causing the accuracy of detecting main-withstand-voltage deterioration of any of the semiconductor switching elements to become poor, and reference voltages in the abnormality detection unit 10 provided for the U phase can be set in consideration of the insulation characteristic of the AC motor 70.

As an example, a case where, for example, the semiconductor switching element M5 on the upper arm for the W phase has sustained main-withstand-voltage deterioration so that the leakage current has increased, is assumed. In this case, in a state where the power converter 30 has stopped switching operation, and the potential at the arm midpoint (the connection point between the upper and lower arms) in each of the phases is stabilized, the potential at the arm midpoint in the W phase becomes higher than the potential in a normal case. For example, in a case where the resistance value between both ends of the second resistor group 5 provided in the abnormality detection unit 10 is equal to the resistance value between both ends of the third resistor group 6 provided in the abnormality detection unit 10, when main-withstand-voltage deterioration has not occurred, the potential at the arm midpoint in the W phase is approximate to a half voltage VB/2 of the DC voltage VB, whereas, when main-withstand-voltage deterioration has occurred, said potential is changed in such a direction as to become higher than VB/2. In this case, since windings for the three phases are electrically connected in the AC motor 70, the potentials at the arm midpoints in the respective U and V phases also become equal to the potential at the arm midpoint in the W phase. Therefore, as in the configuration in FIG. 8, the abnormality detection unit 10 provided to the U phase alone can detect main-withstand-voltage deterioration regardless of which element among the semiconductor switching elements composing the power converter 30 has sustained the deterioration.

The above description has been given on the assumption that the AC motor 70 has a normal insulation characteristic. Meanwhile, in a case where the insulation characteristic has decreased owing to a certain factor, the potential at each of the arm midpoints is changed in such a direction as to become lower than the half voltage VB/2 of the DC voltage VB. Thus, the power conversion device 110 according to the present embodiment also enables, when the AC motor 70 being driven has sustained insulation deterioration, detection of the deterioration. However, when the potential at the arm midpoint is changed in such a direction as to become lower than the half voltage VB/2 of the DC voltage VB, it might be impossible to determine whether the detected deterioration is insulation deterioration of the AC motor 70 or main-withstand-voltage deterioration of any of the semiconductor switching elements. In order to assuredly determine which type of deterioration has occurred, for example, a switch is provided between the arm midpoint and the motor, and whether or not any of the semiconductor switching elements has sustained main-withstand-voltage deterioration is checked in a state where the motor is disconnected. By doing so, it is possible to determine whether the detected deterioration is main-withstand-voltage deterioration of any of the semiconductor switching elements or insulation deterioration of the motor.

Although a case where the power converter 30 outputs positive and negative two-level AC voltages has been described, the configuration of the present embodiment is also applicable to an inverter that has an arbitrarily-determined number of semiconductor switching elements connected in series and in parallel and that can output multilevel voltages.

Embodiment 4

Figure 9:
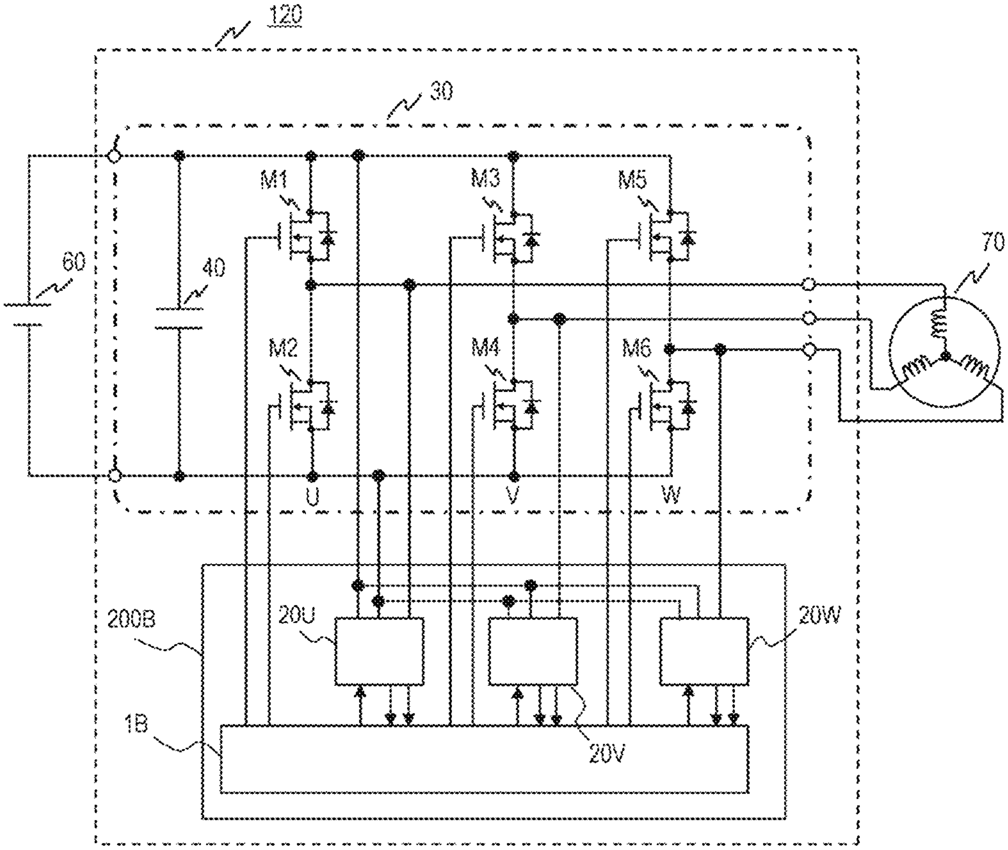
FIG. 9 shows a configuration of a power conversion device according to embodiment 4.

FIG. 9 shows a configuration of a power conversion device 120 according to embodiment 4. Hereinafter, differences from embodiment 3 will be described. The power conversion device 120 according to the present embodiment is also an inverter in which DC power from the DC power supply 60 is converted into three-phase AC power which is then supplied to the AC motor 70, in the same manner as in embodiment 3. Each of the semiconductor switching elements in the power conversion device 120 is controlled to be turned on and off by a gate control unit 1B provided in a semiconductor drive control unit 200B. The power conversion device 120 according to the present embodiment 4 differs from the power conversion device in embodiment 3 in that abnormality detection units 20U, 20V, and 20W each having the same configuration as that of the abnormality detection unit 20 in embodiment 2 are provided, as abnormality detection units in the semiconductor drive control unit 200B, for detecting abnormalities in the arm pairs for the U phase, the V phase, and the W phase, respectively, In the same manner as the abnormality detection unit 20 in embodiment 2, each of the abnormality detection units 20U, 20V, and 20W performs, on the basis of the result of determination by the corresponding abnormality determination unit, detection of main-withstand-voltage deterioration of any of the semiconductor switching elements, and arm short-circuit detection or dead time detection. Here, in embodiment 3, determination of main-withstand-voltage deterioration of any of the semiconductor switching elements can be performed by using a detection voltage of any of the arms for the three phases, but arm short-circuit detection and dead time detection need to be performed by using detection voltages of the respective arm pairs for the three phases. To this end, the semiconductor drive control unit 200B in the present embodiment 4 includes the three abnormality detection units 20U, 20V, and 20W, In a case where the first reference voltage and the second reference voltage are set to be the same among the abnormality detection units 20U, 20V, and 20W, a configuration may be employed in which, for example, outputs of the first reference voltage and the second reference voltage generated by the reference voltage generation circuit provided to the abnormality detection unit 200 are inputted to the abnormality detection unit 20V and the abnormality detection unit 20W.

By thus combining the functions of detection of main-withstand-voltage deterioration of any of the semiconductor switching elements, arm short-circuit detection, and dead time detection, an inexpensive power conversion device 120 that can highly accurately detect an abnormality is obtained.

Embodiment 5

Figure 10:
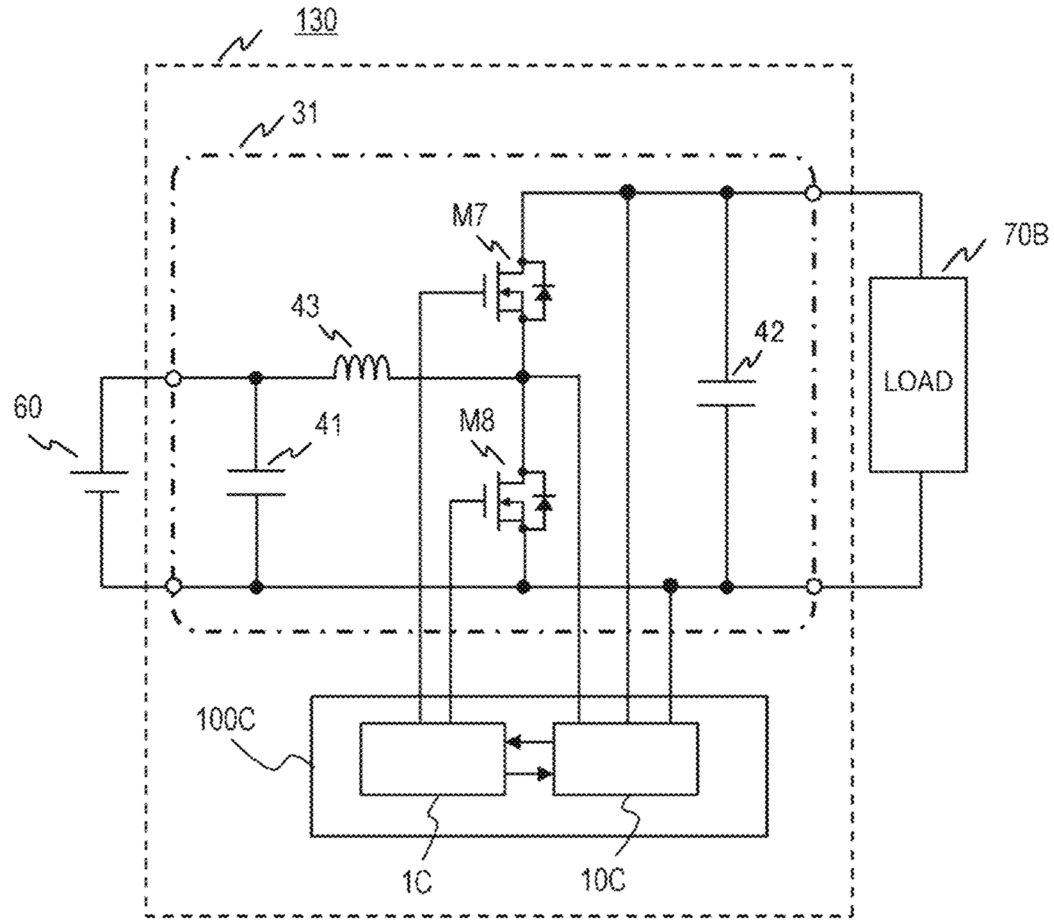
FIG. 10 shows a configuration of a power conversion device according to embodiment 5.

FIG. 10 shows a configuration of a power conversion device 130 according to embodiment 5. Hereinafter, differences from embodiment 3 and embodiment 4 will be described. The power conversion device 130 according to the present embodiment 5 includes: a power converter 31 configured to have an arm pair composed of a semiconductor switching element M7 and a semiconductor switching element M8; and a semiconductor drive control unit 100C having an abnormality detection unit 10C and a gate control unit 1C for driving the semiconductor switching elements M7 and M8 in the power converter 31. In this case, the power converter 31 is a boost converter for boosting the DC voltage of the DC power supply 60 and supplying the boosted voltage to a DC load 70B. The abnormality detection unit 10C has the same configuration as that of either the abnormality detection unit 10 having the function of diagnosing main-withstand-voltage deterioration described in embodiment 1 or the abnormality detection unit 20 additionally having the arm short-circuit detection function and/or the dead time detection function described in embodiment 2.

The power converter 31 includes: an arm pair composed of the semiconductor switching element M7 and the semiconductor switching element M8 connected in series; an input-side smoothing capacitor 41; an output-side smoothing capacitor 42; and a boost reactor 43. In this case as well, a power conversion device 130 having an inexpensive configuration and having the function of highly accurately diagnosing main-withstand-voltage deterioration of the semiconductor switching elements, or having the arm short-circuit detection function and further having the dead time detection function in addition to the function of diagnosing main-withstand-voltage deterioration, is obtained. Although a boost converter has been described in the above example, the present embodiment is also applicable to a buck converter or a buck-boost converter in which a boost converter and a buck converter have been combined.

Embodiment 6

Figure 11:
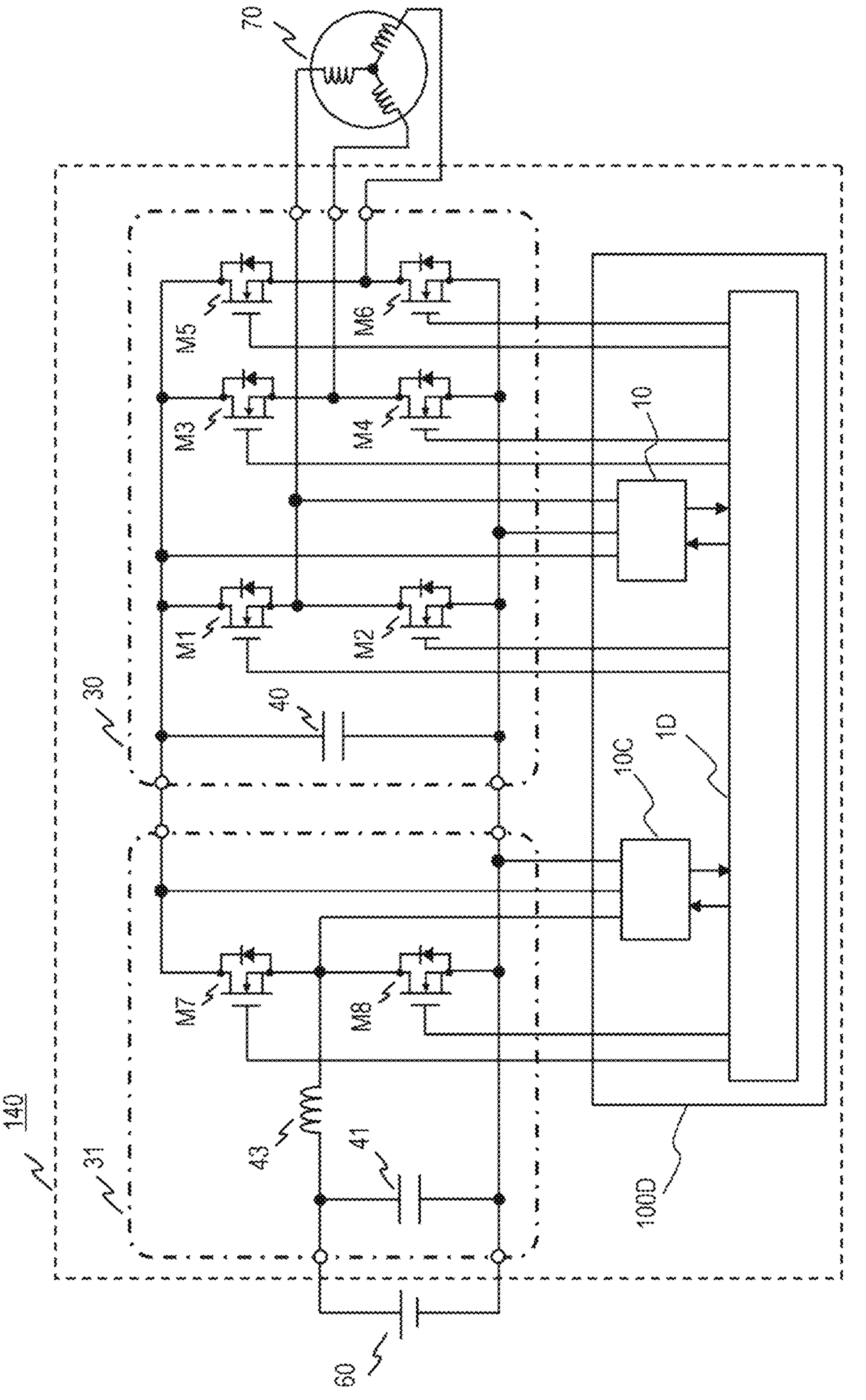
FIG. 11 shows a configuration of a power conversion device according to embodiment 6.

FIG. 11 shows a configuration of a power conversion device 140 according to embodiment 6. Hereinafter, differences from the power conversion device 110 according to embodiment 3 shown in FIG. 8 will be described. The power conversion device 140 according to the present embodiment includes: a power converter in which the power converter 31 as a boost converter shown in FIG. 10 is connected to the DC side of the power converter 30 shown in FIG. 8; and a semiconductor drive control unit 100D having a gate control unit 1D for driving each of the semiconductor switching elements. The semiconductor drive control unit 100D includes two abnormality detection units which are an abnormality detection unit 10 and an abnormality detection unit 10C each for diagnosing main-withstand-voltage deterioration of the semiconductor switching elements in the corresponding one of the power converter 30 and the power converter 31. The abnormality detection unit 10 has the same configuration as that of the abnormality detection unit 10 in embodiment 1, and the abnormality detection unit 10C has the same configuration as that of the abnormality detection unit 10C in embodiment 5.

In this case as well, a power conversion device 140 that has an inexpensive configuration and that can realize elimination of a downtime through highly accurate diagnosis of main-withstand-voltage deterioration of the semiconductor switching elements, is obtained.

In the power conversion device 140, the DC voltage of the DC power supply 60 is boosted by the power converter 31 as a boost converter, the DC power resulting from the boosting is converted into AC power by the power converter 30, and the AC power is supplied to the AC motor 70. The power conversion device 140 is operated as a boosting-type inverter system and is applied to, for example, an electric automobile. The power converter 30 in the power conversion device 140 may be an inverter that can output multilevel voltages. The power converter 31 in the power conversion device 140 is not limited to the boost converter and may be a buck converter or a buck-boost converter in which a boost converter and a buck converter have been combined.

Although MOSFETs are shown as the semiconductor switching elements in the above embodiments 1 to 6, the semiconductor switching elements may be other semiconductor switching elements having control terminals, such as IGBTs. Diodes provided in parallel to the MOSFETs are not limited to body diodes parasitic in the MOSFETs and may be diodes provided separately from the MOSFETs.

A wide-bandgap semiconductor material having a wider bandgap than Si may be used for the semiconductor switching elements of at least one of the arm pairs. By doing so, the speed of switching operations of the semiconductor switching elements is increased, and it is possible to realize decrease of loss in, and downsizing of, the power conversion device. As the wide-bandgap semiconductor material, any of silicon carbide SiC, gallium nitride GaN, a gallium oxide-based material GaO, or diamond may be used.

Figure 12:
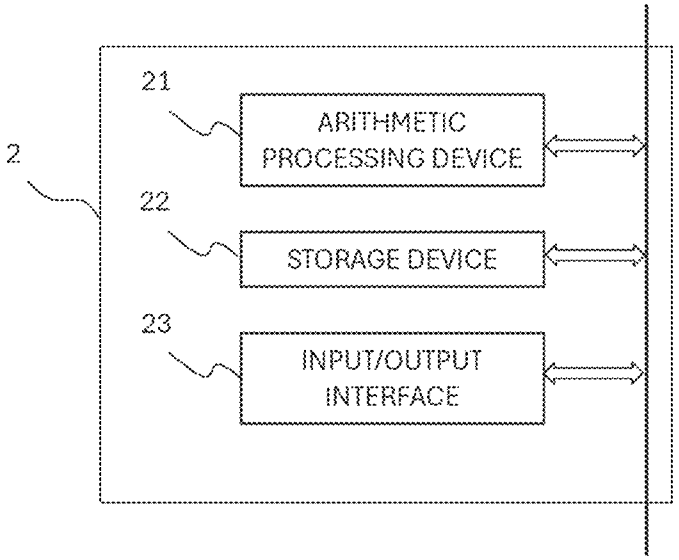
FIG. 12 is a block diagram showing an example of the actual configuration of a gate signal generation unit or each of the gate signal generation unit and an abnormality determination unit, in each of the embodiments.

Each of the abnormality determination units in the above respective embodiments can be implemented by a logic circuit or can be implemented through arithmetic processing by a processor. The gate drive unit can be implemented by a circuit resulting from combining an ordinary integrated circuit and circuit elements such as a resistor and a capacitor. Likewise, the gate signal generation unit can also be implemented by a logic circuit, an integrated circuit, and furthermore, circuit elements such as a resistor. Alternatively, for example, the gate signal generation unit 2 or a combination of the gate signal generation unit and the abnormality determination unit can be implemented by a processing device (such as one shown in FIG. 12) including: an arithmetic processing device 21 such as a central processing unit (CPU); a storage device 22 through which data is received from or transmitted to the arithmetic processing device 21; an input/output interface 23 through which a signal is inputted or outputted between the arithmetic processing device 21 and the outside; and the like.

Although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF THE REFERENCE CHARACTERS

- 1, 1A, 1B, 1C, 1D gate control unit
- 2 gate signal generation unit
- 3 arm pair
- 4 reference voltage generation circuit
- 5 second resistor group
- 6 third resistor group
- 10, 10C, 20, 20U, 20V, 20W abnormality detection unit
- 11, 12 abnormality determination unit
- 100, 100A, 100C, 100D, 200, 200B semiconductor drive control unit
- M1 first semiconductor switching element
- M2 second semiconductor switching element
- C arm midpoint
- C1 first capacitor
- C2 second capacitor
- GA minus terminal
- PA plus terminal
- R1 first resistor
- R2 second resistor
- VdM detection voltage
- VrefH first reference voltage
- VrefL second reference voltage

The invention claimed is:

1. A power conversion device comprising:

an arm pair composed of a first semiconductor switching element and a second semiconductor switching element such that, with one of plus and minus terminals for DC being defined as a first polarity terminal and with another one of the plus and minus terminals being defined as a second polarity terminal, the first semiconductor switching element is connected between the first polarity terminal and an arm midpoint and the second semiconductor switching element is connected between the arm midpoint and the second polarity terminal; and a semiconductor drive control circuitry which has an abnormality detection circuitry and a gate control circuitry and which controls drive of the first semiconductor switching element and the second semiconductor switching element, wherein the abnormality detection circuitry has a third resistor group connected in parallel to the first semiconductor switching element and having at least one resistor, a second resistor group including a series circuitry of a plurality of resistors and connected in parallel to the second semiconductor switching element so as to divide a voltage applied to the second semiconductor switching element, a reference voltage generation circuit which generates a first reference voltage obtained by dividing a voltage between the first polarity terminal and the second polarity terminal and a second reference voltage different from the first reference voltage, the second reference voltage having been obtained by dividing the voltage between the first polarity terminal and the second polarity terminal, and an abnormality determination circuitry which, after the power conversion device stops power conversion operation, compares a detection voltage as a voltage obtained through the voltage division by the second resistor group and each of the first reference voltage and the second reference voltage, and determines whether or not the first semiconductor switching element or the second semiconductor switching element has sustained main-withstand-voltage deterioration.

2. The power conversion device according to claim 1, wherein, after the power conversion device stops power conversion operation, the abnormality determination circuitry determines, when the detection voltage is a voltage other than a voltage between the first reference voltage and the second reference voltage, that the first semiconductor switching element or the second semiconductor switching element has sustained main-withstand-voltage deterioration.

3. The power conversion device according to claim 1, wherein, when the first semiconductor switching element or the second semiconductor switching element is turned on and the detection voltage is a voltage logically inconsistent with the detection voltage obtained in a case where the first semiconductor switching element and the second semiconductor switching element are normal, the abnormality determination circuitry determines that the arm pair is in an arm short-circuit state.

4. The power conversion device according to claim 3, wherein a plurality of the arm pairs are provided, and the abnormality detection circuitry is provided to each of all the arm pairs.

5. The power conversion device according to claim 1, wherein, after the power conversion device stops power conversion operation, the abnormality determination circuitry determines, according to a time that the detection voltage takes to become a voltage other than a voltage between the first reference voltage and the second reference voltage or a change amount of the detection voltage per unit time, whether or not main-withstand-voltage deterioration has occurred.

6. The power conversion device according to claim 1, wherein the abnormality determination circuitry determines, when temperatures of all the semiconductor switching elements are temperatures higher than a surrounding environment temperature, whether or not main-withstand-voltage deterioration has occurred.

7. The power conversion device according to claim 1, wherein a capacitor is connected in parallel to at least one of the resistors in the second resistor group.

8. The power conversion device according to claim 3, wherein the resistors composing the series circuitry included in the second resistor group are a first resistor which is located on the arm midpoint side and which has a resistance value Rs1, and a second resistor which is connected to the first resistor and which has a resistance value Rs2, a first capacitor having a capacitance Cs1 is connected in parallel to the second resistor, a second capacitor having a capacitance Cs2 is connected in parallel to the first resistor, and a relationship represented as $Rs2/(Rs1+Rs2)<Cs2/(Cs1+Cs2)$ is satisfied.

9. The power conversion device according to claim 8, wherein the abnormality determination circuitry calculates a dead time on the basis of a time that the detection voltage takes to cross the first reference voltage or the second reference voltage, from an ON command outputted to the first semiconductor switching element or the second semiconductor switching element by a gate signal generation circuitry provided in the gate control circuitry, and corrects, on the basis of the calculated dead time, a dead time amount based on an ON/OFF signal that is for each of the first semiconductor switching element and the second semiconductor switching element and that is outputted by the gate signal generation circuitry.

10. The power conversion device according to claim 1, wherein a resistance value between both ends of the second resistor group is set such that a value of a current flowing through the second resistor group becomes larger than a value of a leakage current that, in an initial state, is parasitic between main terminals of the second semiconductor switching element connected in parallel to the second resistor group, and a resistance value between both ends of the third resistor group is set such that a value of a current flowing through the third resistor group becomes larger than a value of a leakage current that, in an initial state, is parasitic between main terminals of the first semiconductor switching element connected in parallel to the third resistor group.

11. The power conversion device according to claim 1, wherein a resistance value between both ends of the second resistor group and a resistance value between both ends of the third resistor group are equal to each other.

12. The power conversion device according to claim 1, wherein, after the abnormality determination circuitry determines that either of the semiconductor switching elements has sustained main-withstand-voltage deterioration, the semiconductor drive control circuitry changes operation of the power conversion device so as to decrease a load on said semiconductor switching element.

13. The power conversion device according to claim 1, wherein the power conversion device is a power conversion device including at least one of: a power converter that performs power conversion between DC power and AC power; a boost converter that boosts a DC voltage; and a buck converter that steps down the DC voltage.

14. The power conversion device according to claim 1, wherein the arm pair forms a power conversion circuit that performs power conversion between DC power and AC power, and, in a case where an electric motor is connected as a load on an AC side, after the power conversion device stops power conversion operation, the abnormality determination circuitry determines, when the detection voltage is a voltage other than a voltage between the first reference voltage and the second reference voltage, that either of the semiconductor switching elements has sustained main-withstand-voltage deterioration or that the electric motor has sustained insulation deterioration.

15. The power conversion device according to claim 1, wherein the semiconductor switching elements composing at least one said arm pair are each made from a wide-bandgap semiconductor material having a wider bandgap than Si.

16. A power conversion device comprising:

a plurality of arm pairs each composed of a first semiconductor switching element and a second semiconductor switching element such that, with one of plus and minus terminals for DC being defined as a first polarity terminal and with another one of the plus and minus terminals being defined as a second polarity terminal, the first semiconductor switching element is connected between the first polarity terminal and an arm midpoint and the second semiconductor switching element is connected between the arm midpoint and the second polarity terminal; and a semiconductor drive control circuitry which has an abnormality detection circuitry and a gate control circuitry and which controls drive of the first semiconductor switching element and the second semiconductor switching element in each of all the arm pairs, wherein the abnormality detection circuitry has a third resistor group connected in parallel to the first semiconductor switching element in one arm pair among the plurality of arm pairs and having at least one resistor, a second resistor group including a series circuitry of a plurality of resistors and connected in parallel to the second semiconductor switching element in the one arm pair so as to divide a voltage applied to the second semiconductor switching element in the one arm pair, a reference voltage generation circuit which generates a first reference voltage obtained by dividing a voltage between the first polarity terminal and the second polarity terminal and a second reference voltage different from the first reference voltage, the second reference voltage having been obtained by dividing the voltage between the first polarity terminal and the second polarity terminal, and an abnormality determination circuitry which, after the power conversion device stops power conversion operation, compares a detection voltage as a voltage obtained through the voltage division by the second resistor group and each of the first reference voltage and the second reference voltage, and determines whether or not any of the semiconductor switching elements composing the plurality of arm pairs has sustained main-withstand-voltage deterioration.

17. The power conversion device according to claim 16, wherein, after the power conversion device stops power conversion operation, the abnormality determination circuitry determines, according to a time that the detection voltage takes to become a voltage other than a voltage between the first reference voltage and the second reference voltage or a change amount of the detection voltage per unit time, whether or not main-withstand-voltage deterioration has occurred.

18. The power conversion device according to claim 16, wherein the arm pair forms a power conversion circuit that performs power conversion between DC power and AC power, and, in a case where an electric motor is connected as a load on an AC side, after the power conversion device stops power conversion operation, the abnormality determination circuitry determines, when the detection voltage is a voltage other than a voltage between the first reference voltage and the second reference voltage, that either of the semiconductor switching elements has sustained main-withstand-voltage deterioration or that the electric motor has sustained insulation deterioration.

19. The power conversion device according to claim 16, wherein the abnormality determination circuitry determines, when temperatures of all the semiconductor switching elements are temperatures higher than a surrounding environment temperature, whether or not main-withstand-voltage deterioration has occurred.

20. The power conversion device according to claim 16, wherein a capacitor is connected in parallel to at least one of the resistors in the second resistor group.

* * * * *